(12) United States Patent
Yoon

(10) Patent No.: US 12,513,939 B2
(45) Date of Patent: Dec. 30, 2025

(54) SEMICONDUCTOR DEVICE HAVING A LOW-K GATE SIDE INSULATING LAYER

(71) Applicant: SK hynix Inc., Gyeonggi-do (KR)

(72) Inventor: Young Gwang Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 397 days.

(21) Appl. No.: 18/323,427

(22) Filed: May 25, 2023

(65) Prior Publication Data

US 2024/0162348 A1    May 16, 2024

(30) Foreign Application Priority Data

Nov. 10, 2022 (KR) .......................... 10-2022-0149232

(51) Int. Cl.
*H10D 64/27* (2025.01)
*H10D 30/62* (2025.01)
*H10D 64/01* (2025.01)
*H10D 64/68* (2025.01)

(52) U.S. Cl.
CPC ....... *H10D 30/6211* (2025.01); *H10D 64/017* (2025.01); *H10D 64/513* (2025.01); *H10D 64/689* (2025.01)

(58) Field of Classification Search
CPC ............. H10D 30/6211; H10D 64/017; H10D 64/513; H10D 64/689; H10D 30/024; H10D 30/62; H10D 30/797; H10D 62/822; H10D 30/021; H10D 64/01; H10D 64/511; H10D 64/514; H10D 64/68; H10D 30/60; H10D 64/681; H10D 64/671

See application file for complete search history.

(56) References Cited

FOREIGN PATENT DOCUMENTS

KR        10-2166238 B1    10/2020
KR    10-2021-0105801 A     8/2021

*Primary Examiner* — Elias Ullah
(74) *Attorney, Agent, or Firm* — IP & T GROUP LLP

(57) ABSTRACT

A semiconductor device includes a gate structure crossing an active region of a substrate, and spacers formed on both side surfaces of the gate structure. The gate structure includes an interfacial insulating layer formed on the substrate, a gate dielectric layer formed on the interfacial insulating layer, a gate barrier layer and gate side insulating layers formed on the gate dielectric layer, and a gate electrode on the gate barrier layer. The gate dielectric layer is in contact with inner side surfaces of the spacers, and has a U-shaped longitudinal cross-sectional shape to surround a lower surface and some portions of side surfaces of the gate barrier layer. The gate side insulating layers surround outer side surfaces of the gate barrier layer.

19 Claims, 29 Drawing Sheets

SEMICONDUCTOR DEVICE HAVING A LOW-K GATE SIDE INSULATING LAYER

CROSS-REFERENCE TO RELATED APPLICATIONS

The present application claims priority to Korean Patent Application No. 10-2022-0149232, filed on Nov. 10, 2022, which is incorporated herein by reference in its entirety.

BACKGROUND

1. Technical Field

Various embodiments of the present disclosure relate to a semiconductor device and a method of manufacturing the same.

2. Related Art

As the degree of integration of semiconductor devices increases, and miniaturization of the semiconductor devices is in progress, a resistance-capacitance (RC) delay due to parasitic capacitance between a gate electrode and contact plugs is of concern.

SUMMARY

Various embodiments of the present disclosure are directed to a semiconductor device that can reduce parasitic capacitance between a gate electrode and contact plugs.

In addition, various embodiments of the present disclosure are directed to a semiconductor device that can increase conductivity of a gate electrode.

In accordance with one embodiment of the present disclosure, a semiconductor device includes: a gate structure crossing an active region of a substrate; and spacers formed on both side surfaces of the gate structure. The gate structure includes: an interfacial insulating layer formed on the substrate; a gate dielectric layer formed on the interfacial insulating layer; a gate barrier layer and gate side insulating layers formed on the gate dielectric layer; and a gate electrode on the gate barrier layer. The gate dielectric layer is in contact with inner side surfaces of the spacers, and has a U-shaped longitudinal cross-sectional shape to surround a lower surface and some portions of side surfaces of the gate barrier layer. The gate side insulating layers surround outer side surfaces of the gate barrier layer.

In accordance with another embodiment of the present disclosure, a semiconductor device includes: a gate structure crossing an active region of a substrate; and spacers formed on both side surfaces of the gate structure. The gate structure includes: a gate electrode; a gate barrier layer surrounding a lower surface and side surfaces of the gate electrode; a gate dielectric layer surrounding a lower surface and lower portions of side surfaces of the gate barrier layer; and a gate side insulating layers on upper portions of the side surfaces of the gate barrier layer. Outer side surfaces of the gate dielectric layer and outer side surfaces of the gate side insulating layers are vertically aligned to be vertically coplanar.

In accordance with still another embodiment of the present disclosure, a method of manufacturing a semiconductor device includes: forming a dummy gate structure on a substrate; forming gate spacers on both side surfaces of the dummy gate structure; forming a gate trench between the gate spacers by removing the dummy gate structure; forming an interfacial insulating layer on the substrate exposed in the gate trench; forming a gate dielectric layer on an upper surface of the interfacial insulating layer in the gate trench and inner sidewalls of the gate spacers; removing an upper portion of the gate dielectric layer; forming gate side insulating layers on some portions of an upper surface of the gate dielectric layer and the inner sidewalls of the gate spacers; forming a gate barrier layer on the upper surface and inner side surfaces of the gate dielectric layer and inner side surfaces of the gate side insulating layer; and forming a gate electrode to fill the gate trench and be surrounded by the gate barrier layer.

DETAILED DESCRIPTION

Figure 1:
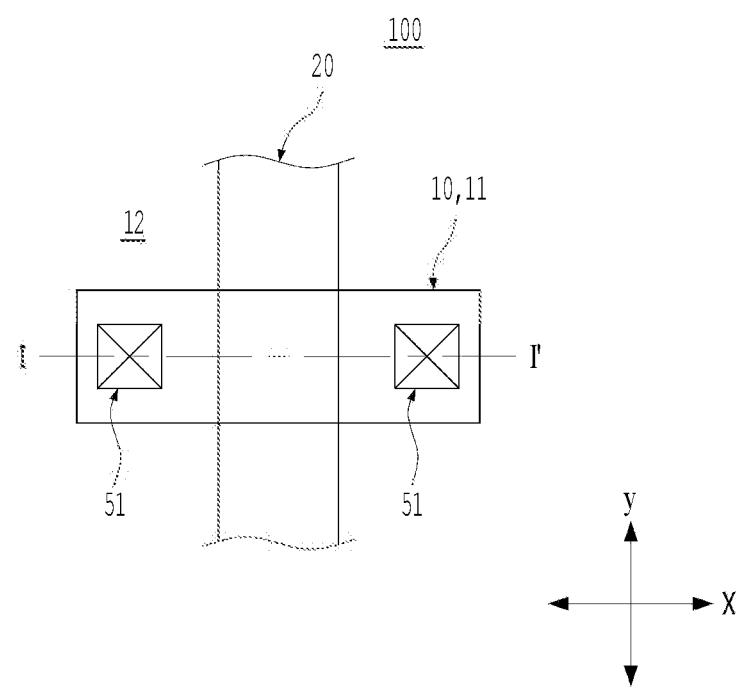
FIG. 1 is a layout of a semiconductor device in accordance with one embodiment of the present disclosure.

Various examples and implementations of the disclosed technology are described below in detail with reference to the accompanying drawings. The drawings may not necessarily be to scale and in some instances, proportions of structures in the drawings may have been exaggerated to clearly illustrate certain features of the described examples or implementations. In presenting a specific example in a drawing or detailed description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. Throughout the disclosure, like reference numerals refer to like parts in the various figures and embodiments of the present disclosure. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

FIG. 1 is a layout of a semiconductor device 100 in accordance with one embodiment of the present disclosure. Referring to FIG. 1, the semiconductor device 100 in accordance with this embodiment of the present disclosure may include a substrate 10 having an active region 11 including source/drain regions defined by an isolation region 12, a gate structure 20 crossing the substrate 10 or the active region 11, and contact plugs 51 disposed in the active region 11 on both sides of the gate structure 20. The substrate 10 and/or the active region 11 may extend in a first horizontal direction X, and the gate structure 20 may extend in a second horizontal direction Y. The first horizontal direction X and the second horizontal direction Y may be perpendicular to each other. The present invention is not limited to the substrate/active region and the gate structure extending in the X and Y directions, nor necessarily the extending directions being perpendicular to each other.

Figure 2:
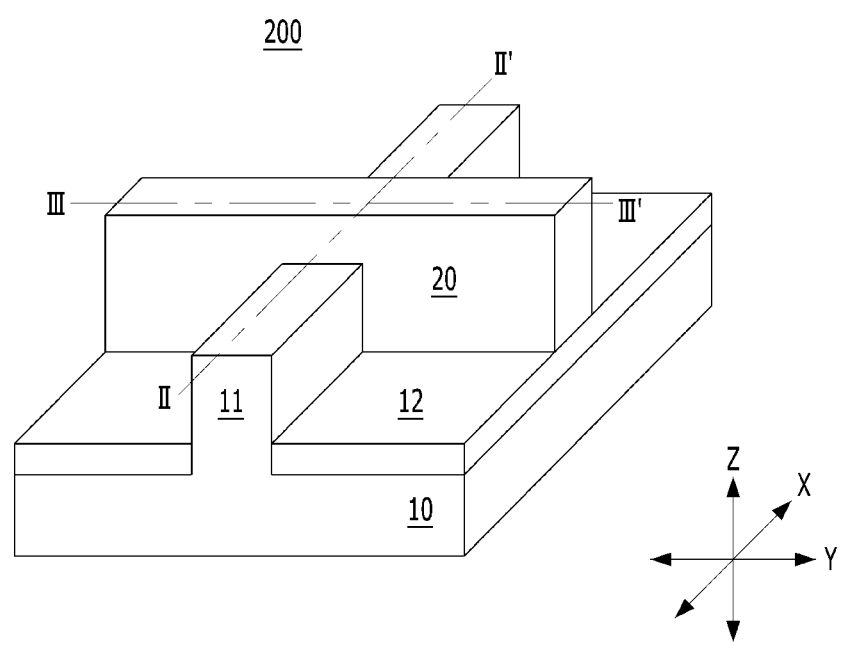
FIG. 2 is a perspective view schematically illustrating a semiconductor device in accordance with another embodiment of the present disclosure.

FIG. 2 is a perspective view schematically illustrating a semiconductor device 200 in accordance with one embodiment of the present disclosure. Referring to FIG. 2, the semiconductor device 200 in accordance with this embodiment of the present disclosure may include a fin active region 11 protruding from a substrate 10, an isolation region 12 defining the fin active region 11, and a gate structure crossing the fin active region 11.

Figure 3A:
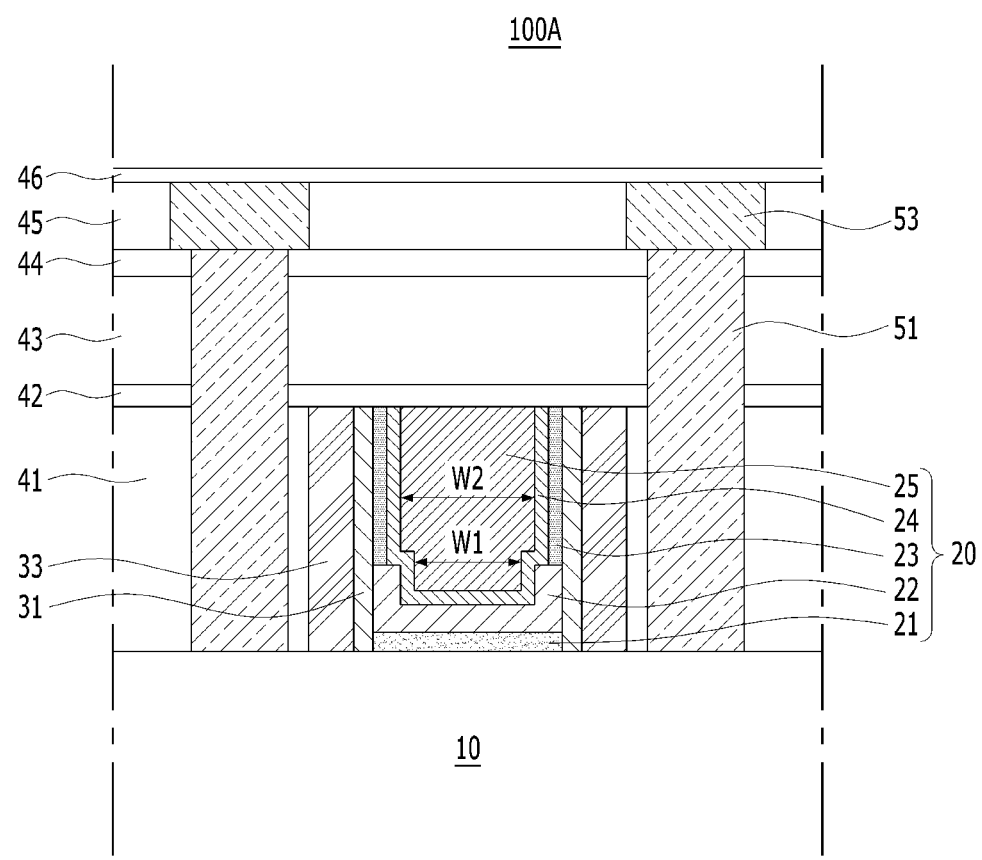
FIGS. 3A to 3C are longitudinal cross-sectional views illustrating semiconductor devices taken along an I-I' line shown in FIG. 1, in accordance with various embodiments of the present disclosure.
Figure 3B:
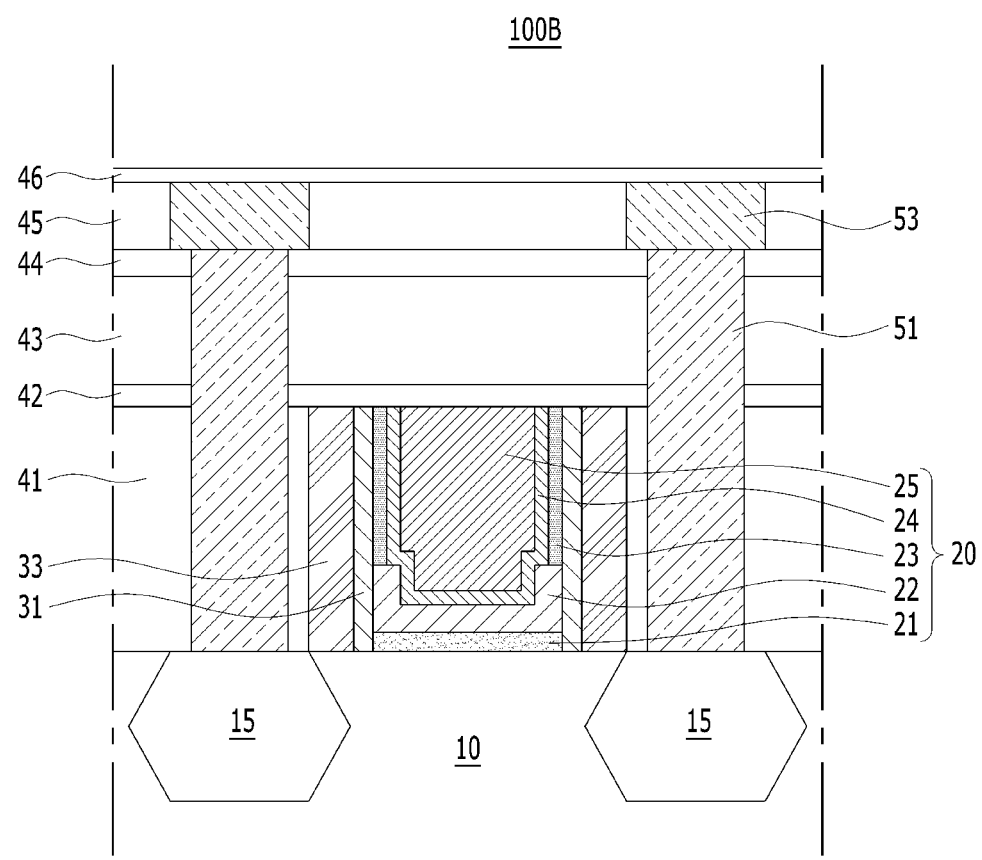
Figure 3C:
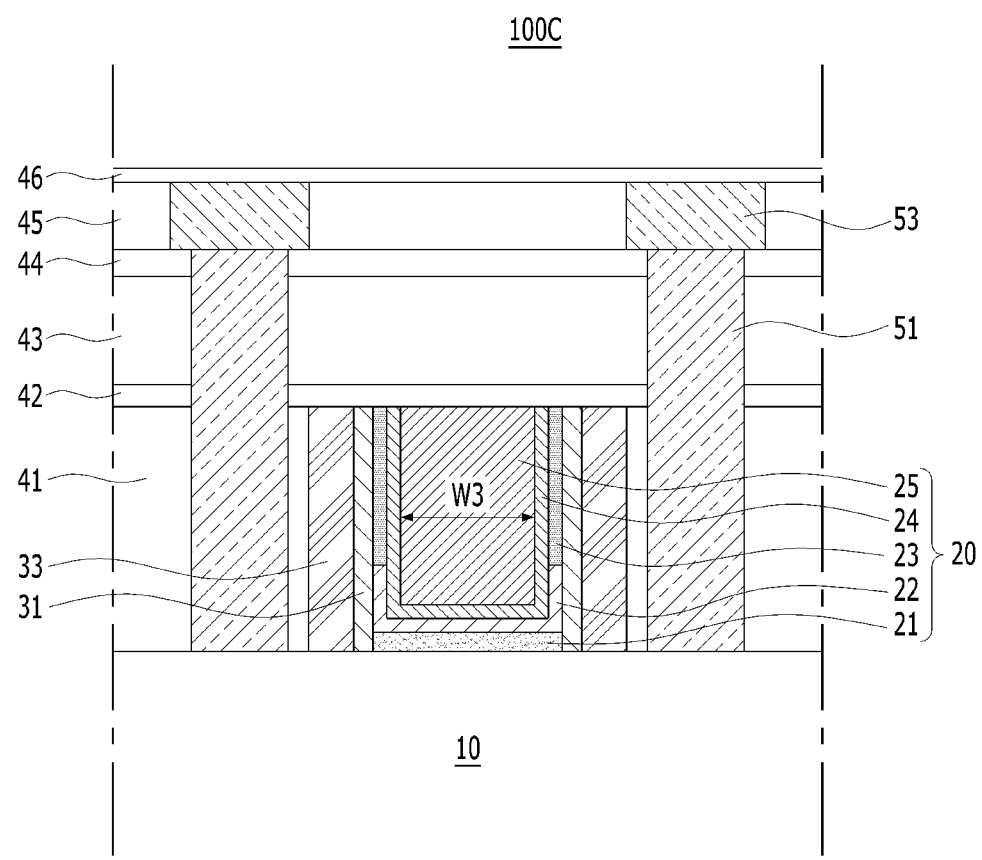

FIGS. 3A to 3C are longitudinal cross-sectional views illustrating semiconductor devices 100A to 100C taken along a line I-I' shown in FIG. 1, in accordance with embodiments of the present disclosure. Referring to FIGS. 3A, the semiconductor device 100A in accordance with this embodiment of the present disclosure may include a gate structure 20 disposed on a substrate 10, and spacers 31 and 33 disposed on side surfaces of the gate structure 20. The semiconductor device 100A may further include interlayer insulating layers 41, 43 and 45, capping layers 42, 44 and 46, contact plugs 51, and interconnections 53. The gate structure 20 may include an interfacial insulating layer 21, a gate dielectric layer 22, gate side insulating layers 23, a gate barrier layer 24, and a gate electrode 25. The spacers 31 and 33 may include inner gate spacers 31 and outer gate spacers 33. The interlayer insulating layers 41, 43 and 45 may include a lower interlayer insulating layer 41, an intermediate interlayer insulating layer 43, and an upper interlayer insulating layer 45. The capping layers 42, 44 and 46 may include a lower capping layer 42, an intermediate capping layer 44, and an upper capping layer 46.

The interfacial insulating layer 21 may be directly formed on an upper surface of the substrate 10 between the inner gate spacers 31. The interfacial insulating layer 21 may have a plate shape. The interfacial insulating layer 21 may include an oxidized silicon layer. Both side end portions of the interfacial insulating layer 21 may be in contact with lowermost portions of inner side surfaces of the inner gate spacers 31.

The gate dielectric layer 22 may be formed on the interfacial insulating layer 21 between the inner gate spacers 31. For example, an upper surface of the interfacial insulating layer 21 and a lower surface of the gate dielectric layer 22 may be in contact with each other. Side surfaces of the gate dielectric layer 22 may be in contact with lower portions of the inner side surfaces of the inner gate spacers 31. A central portion of the gate dielectric layer 22 may be recessed, and thus the gate dielectric layer 22 may have a U-shaped longitudinal cross-sectional shape partially surrounding a lower portion of the gate barrier layer 24. That is, both side portions of the gate dielectric layer 22 may have a staircase configuration surrounding a lower surface and side surfaces of the lower portion of the gate barrier layer 24. The gate dielectric layer 22 may include a high-k dielectric material or a ferroelectric dielectric material. For example, the gate dielectric layer 22 may include hafnium oxide (HfO), zirconium oxide (ZrO), hafnium zirconium oxide (HfZrO), hafnium zirconium oxynitride (HfZrON), hafnium silicon oxynitride (HfSiON), or a combination thereof, or one or more of various other high dielectric materials and ferroelectric materials.

The gate side insulating layers 23 may be conformally formed on upper portions of the inner side surfaces of the inner gate spacers 31, respectively. For example, the gate side insulating layers 23 may be in contact with and surround portions of an upper surface of the gate dielectric layer 22, upper portions of the inner side surfaces of the inner gate spacers 31, and outer side surfaces of an upper portion of the gate barrier layer 24, respectively. The gate side insulating layers 23 may each have an I-shaped longitudinal cross-sectional shape. A horizontal width or thickness of each of the gate side insulating layers 23 may be smaller than a horizontal width or thickness of the gate dielectric layer 22. Outer side surfaces of the gate dielectric layer 22 and outer side surfaces of the gate side insulating layers 23 may be vertically aligned to each other to be vertically coplanar. The outer side surfaces of the gate dielectric layer 22 and the outer side surfaces of the gate side insulating layers 23 may be in contact with the inner side surfaces of the inner gate spacers 31. Each of the gate side insulating layers 23 may have a lower dielectric constant than the gate dielectric layer 22. For example, the gate side insulating layers 23 may each include a low-k dielectric insulator containing silicon and oxygen, such as silicon oxide ($SiO_2$), silicon boron oxide (SiBO), silicon carbon oxide (SiCO), silicon boron carbon oxide (SiBCO), silicon boron oxygen nitride (SiBON), silicon carbon oxygen nitride (SiCON) or silicon boron carbon oxygen nitride (SiBCON), or a combination thereof, or one or more various low-k dielectric insulators.

The gate barrier layer 24 may be conformally formed on the upper surface of the gate dielectric layer 22 and inner side surfaces of the gate side insulating layers 23. The gate barrier layer 24 may have a staircase longitudinal cross-sectional shape on both side portions of the gate dielectric layer 22. For example, the gate barrier layer 24 may be conformally formed on surfaces of the recessed central portion and on protruding side portions of the gate dielectric layer 22. The gate barrier layer 24 may include a conductive barrier metal such as titanium nitride (TiN). The gate barrier layer 24 may have a U-shaped cross-sectional shape surrounding a lower surface and side surfaces of the gate electrode 25.

The gate electrode 25 may have a plug shape surrounded by the gate barrier layer 24. The gate electrode 25 may have a protrusion portion downwardly protruding to be formed in the recessed central portion of the gate dielectric layer 22 and a body surrounded by the gate side insulating layers 23. A horizontal width (horizontal thickness) W1 of the protrusion portion may be smaller than a horizontal width (horizontal thickness) W2 of the body. That is, since the gate side insulating layers 23 are thinner than the gate dielectric layer 22, a volume of the gate electrode 25 may increase.

The respective inner gate spacers 31 may be conformally formed on side surfaces of the interfacial insulating layer 21, the gate dielectric layer 22, and the gate side insulating layers 23. The inner gate spacers 31 may include for example one or more of silicon oxide, silicon carbon oxide, silicon carbon nitride, and silicon carbon oxynitride, or a combination thereof. In one embodiment of the present disclosure, the inner gate spacers 31 may each include silicon carbon oxide with a nitrided surface.

The outer gate spacers 33 may be conformally formed on outer side surfaces of the inner gate spacers 31, respectively. The outer gate spacers 33 may each include a silicon nitride-based insulator. For example, the outer gate spacers 33 may each include for example silicon nitride, silicon carbon nitride, or silicon carbon oxynitride, or a combination thereof.

The lower interlayer insulating layer 41, the intermediate interlayer insulating layer 43, and the upper interlayer insulating layer may each include a silicon oxide-based insulator. For example, the lower interlayer insulating layer 41, the intermediate interlayer insulating layer 43, and the upper interlayer insulating layer 45 may each include silicon oxide ($SiO_2$), silicon carbon oxide, silicon boron oxide, silicon hydrogen oxide, silicon carbon hydrogen oxide, a combination thereof, or one of other insulators containing silicon and oxygen.

The lower capping layer 42, the intermediate capping layer 44, and the upper capping layer 46 may each include a silicon nitride-based insulator. For example, the lower capping layer 42, the intermediate capping layer 44, and the upper capping layer 46 may each include silicon nitride, silicon carbon nitride, silicon boron nitride, silicon boron carbon nitride, or one of other insulators containing silicon and nitrogen.

The contact plugs 51 may be connected to the substrate 10 by vertically passing through the lower interlayer insulating layer 41, the lower capping layer 42, the intermediate interlayer insulating layer 43, and the intermediate capping layer 44. The contact plugs 51 may each include a liner insulating layer, a conductive barrier layer, and a metallic plug. Accordingly, the gate spacers 31 and 33 may be disposed between the gate structure 20 and the contact plugs 51.

The interconnections 53 may be formed in trenches formed in the upper interlayer insulating layer 45. The interconnections 53 may each include a conductive barrier layer such as titanium nitride (TiN) and a metallic interconnection plug such as tungsten (W). The interconnections 53 may be electrically connected to the contact plugs 51.

Referring to FIG. 3B, the semiconductor device 100B in accordance with another embodiment of the present disclosure may further include epitaxially grown source/drain regions 15 formed in the substrate 10, as compared to the semiconductor device 100A described with reference to FIG. 3A. The source/drain regions 15 may each include a silicon-germanium layer. The source/drain regions 15 may be electrically connected to the contact plugs 51.

Referring to FIG. 3C, the semiconductor device 100C in accordance with still another embodiment of the present disclosure may include the gate dielectric layer 22 having a smaller horizontal width or horizontal thickness, as compared to the semiconductor device 100A described with reference to FIG. 3A. For example, the horizontal width or horizontal thickness of the gate dielectric layer 22 may be similar to that of each of the gate side insulating layers 23. Accordingly, the gate electrode 25 may have a similar horizontal thickness (horizontal thickness) W3 when viewed as a whole.

Figure 4:
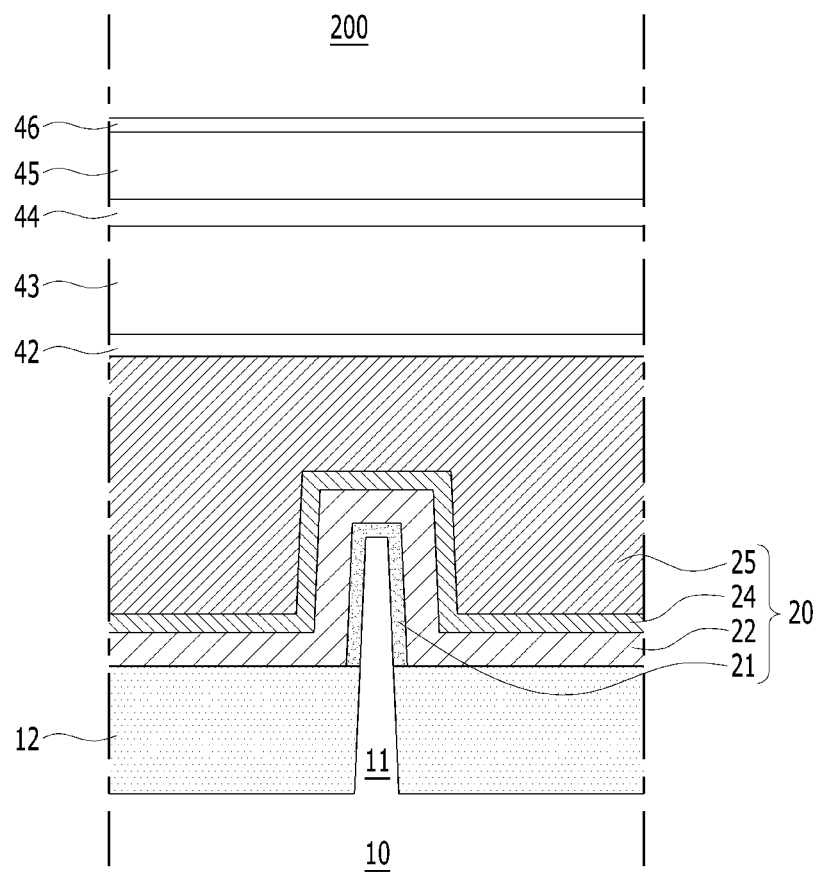
FIG. 4 is a longitudinal cross-sectional view illustrating a semiconductor device taken along a III-III' line shown in FIG. 2, in accordance with one embodiment of the present disclosure.

FIG. 4 is a longitudinal cross-sectional view illustrating the semiconductor device 200 taken along a line III-III' shown in FIG. 2, in accordance with one embodiment of the present disclosure. It may be understood that FIGS. 3A to 3C are longitudinal cross-sectional views illustrating the semiconductor device 200 taken along a line II-II' shown in FIG. 2.

The semiconductor devices 100, 100A to 100C and 200 in accordance with various embodiments of the present disclosure of the present disclosure each include an insulating layer having a low dielectric constant between the gate electrode 25 and the contact plugs 51. For example, the gate side insulating layers 23 each having a low dielectric constant may be interposed between the gate electrode 25 and the contact plugs 51. The gate dielectric layer 22 having a high dielectric constant may be formed only between the gate electrode 25 and the substrate 10 or the fin active region 11. That is, the gate dielectric layer 22 having a high dielectric constant might not be formed between the gate electrode 25 and the contact plugs 51.

Accordingly, parasitic capacitance between the gate electrode 25 and the contact plugs 51 may be reduced, and an RC delay of each of the semiconductor devices 100, 100A to 100C, and 200 can be reduced.

In one embodiment, since the gate side insulating layers 23 are thinner than the gate dielectric layer 22, the volume of the gate electrode 25 may increase. That is, resistance of the gate electrode 25 may decrease, and operating speed of each of the semiconductor devices 100, 100A to 100C, and 200 can increase.

In one embodiment, when the gate dielectric layer 22 includes a ferroelectric material, the gate dielectric layer 22 does not exist on the sidewall of the gate electrode 25, and thus the influence of the dipole of the ferroelectric can be eliminated.

In another embodiment, since the gate dielectric layer 22 having a high dielectric constant is still formed on both lower side portions of the gate structure 20, the effect by diffusion of impurities, such as atoms of C, H, etc., of a low dielectric material can be minimized.

Referring to FIGS. 3A to 3C and FIG. 4, the semiconductor device 200 in accordance with another embodiment of the present disclosure may include an isolation region 12 formed on a substrate 10 to define a fin active region 11 protruding from the substrate 10, a gate structure 20, interlayer insulating layers 41, 43 and 45, and capping layers 42, 44 and 46. The gate structure 20 may include an interfacial insulating layer 21, a gate dielectric layer 22, a gate barrier layer 23, and a gate electrode 25. The interfacial insulating layer 21 may be formed on upper and side surfaces of the fin active region 11. The gate dielectric layer 22 may surround the interfacial insulating layer 21 and extend onto the isolation region 12. The gate barrier layer 24 may be conformally formed on the gate dielectric layer 22. The gate electrode may be formed on the gate barrier layer 24. Other elements not described may be understood with reference to FIGS. 3A to 3C.

Figure 5A:
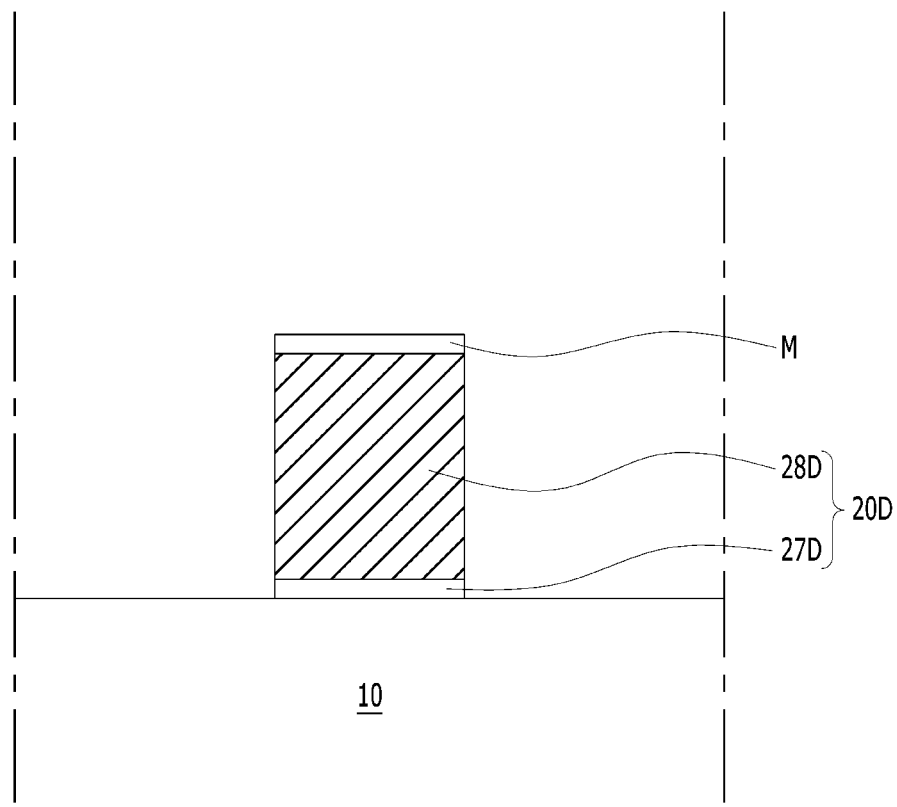
FIGS. 5A to 5O are longitudinal cross-sectional views illustrating a semiconductor device taken along an I-I' line shown in FIG. 1, for describing a method of forming the semiconductor device in accordance with another embodiment of the present disclosure.
Figure 5B:
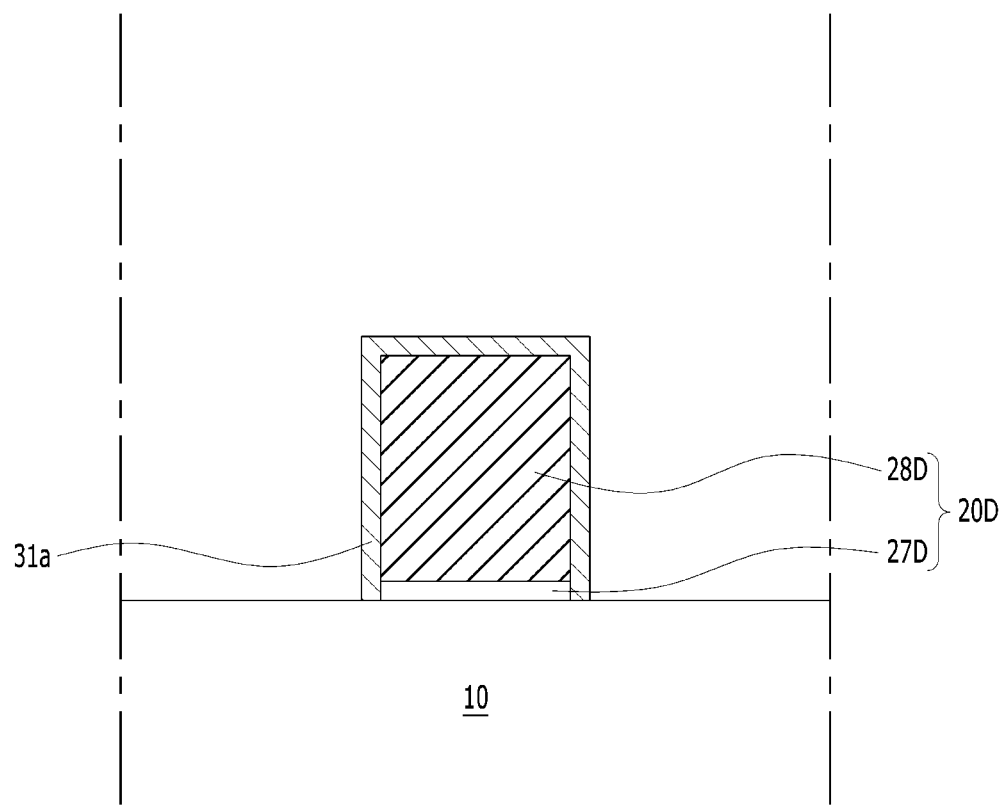
Figure 5C:
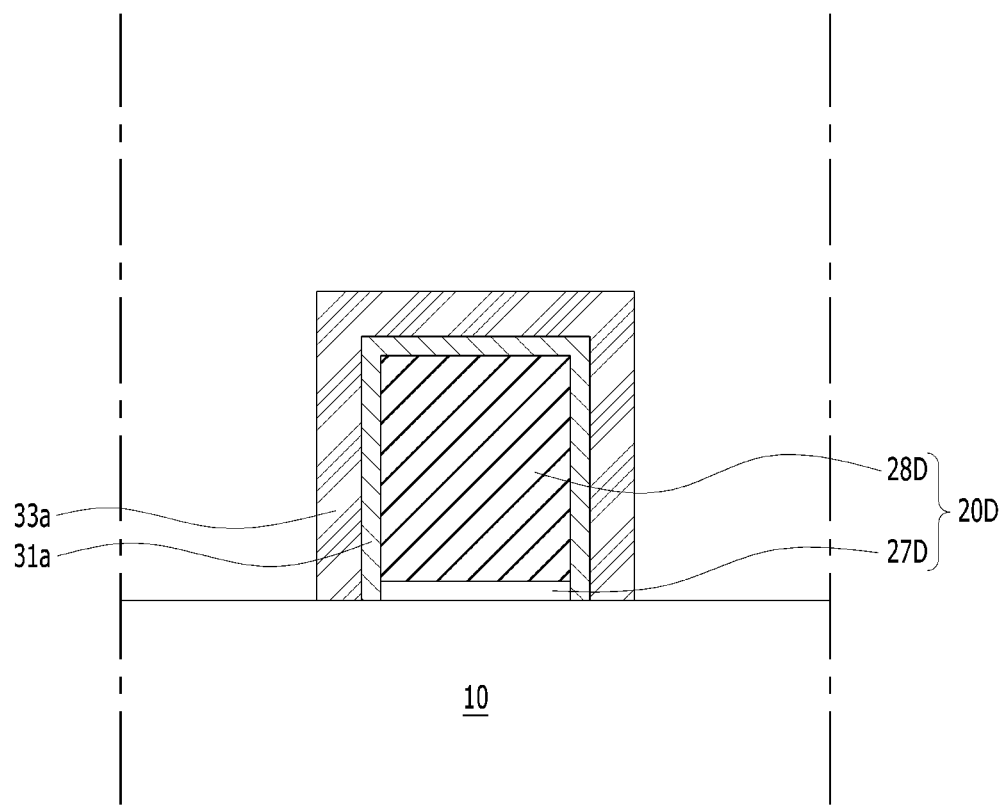
Figure 5D:
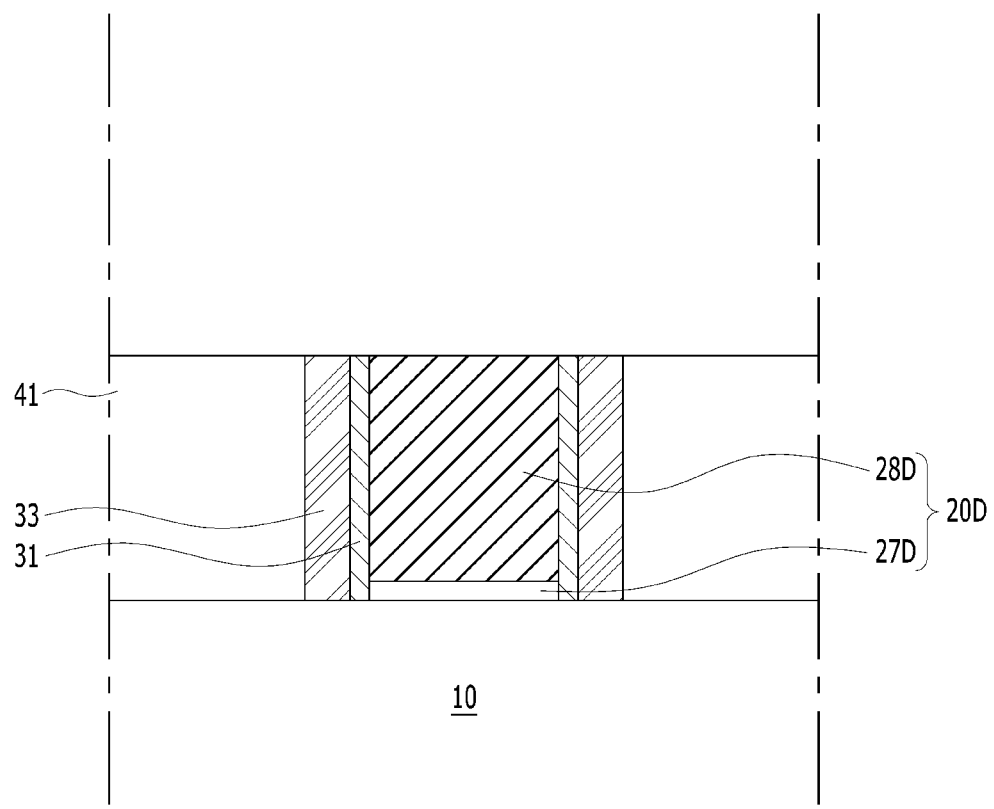
Figure 5E:
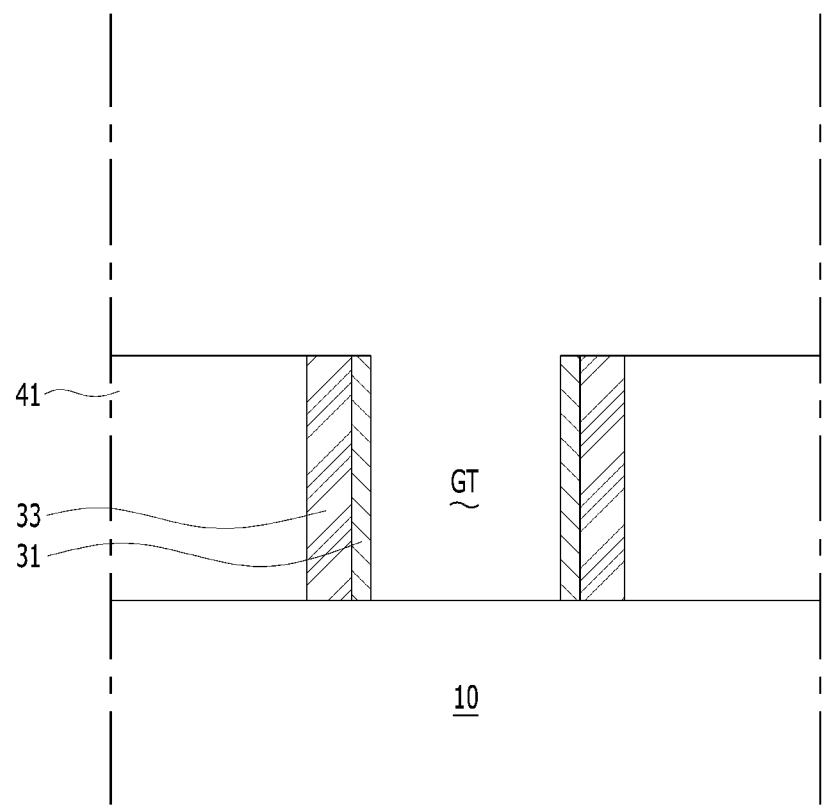
Figure 5F:
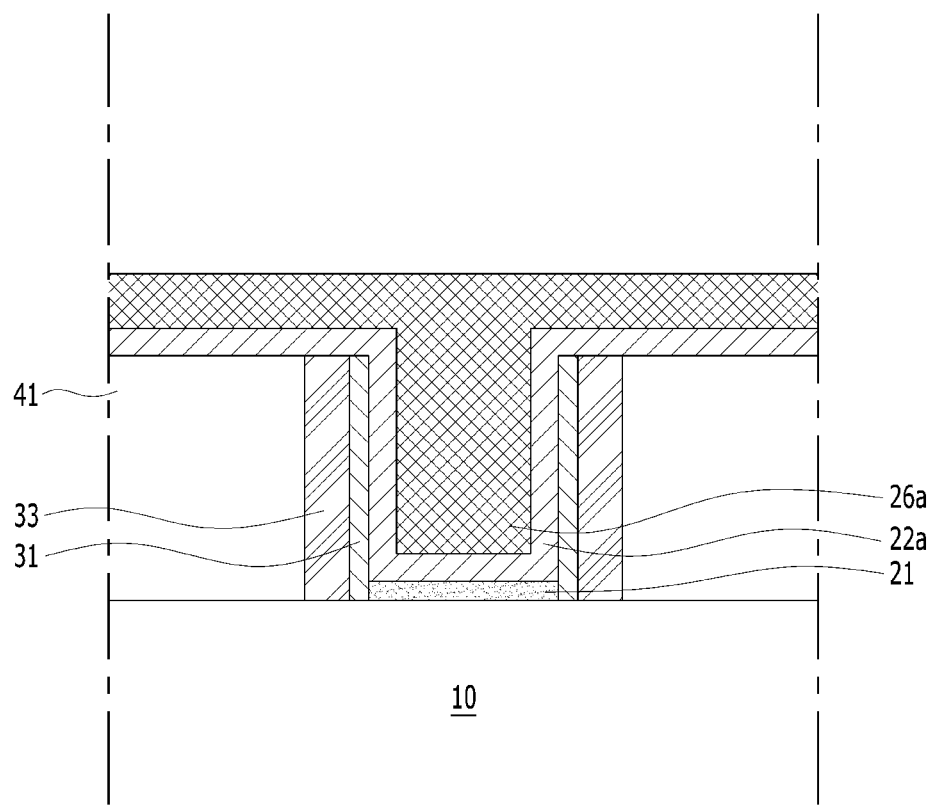
Figure 5G:
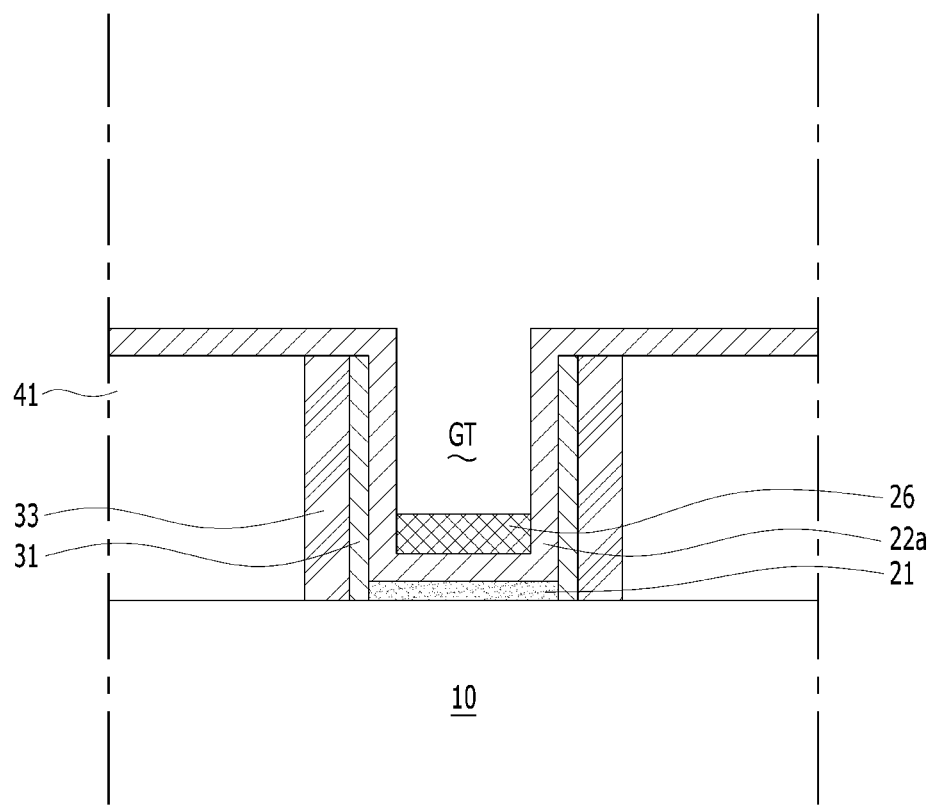
Figure 5H:
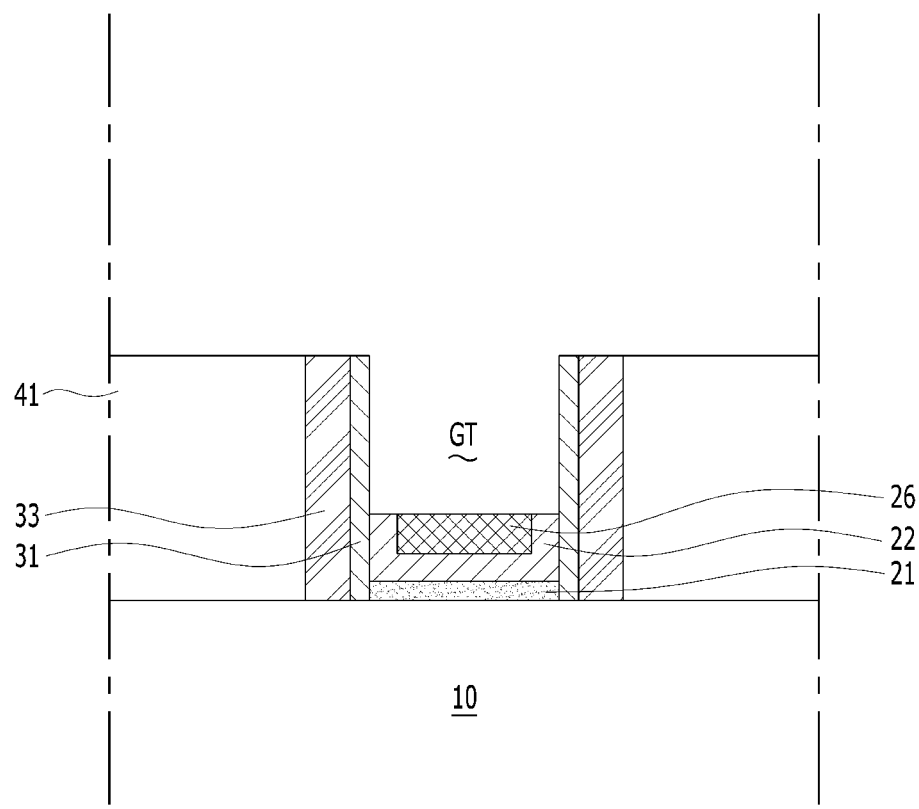
Figure 5I:
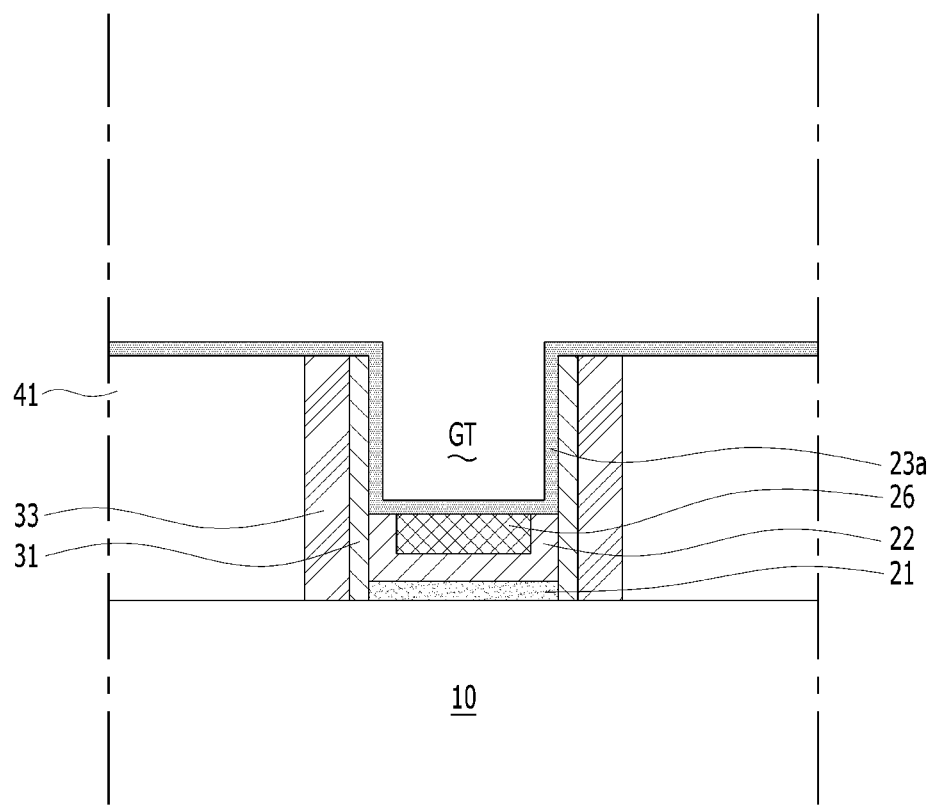
Figure 5J:
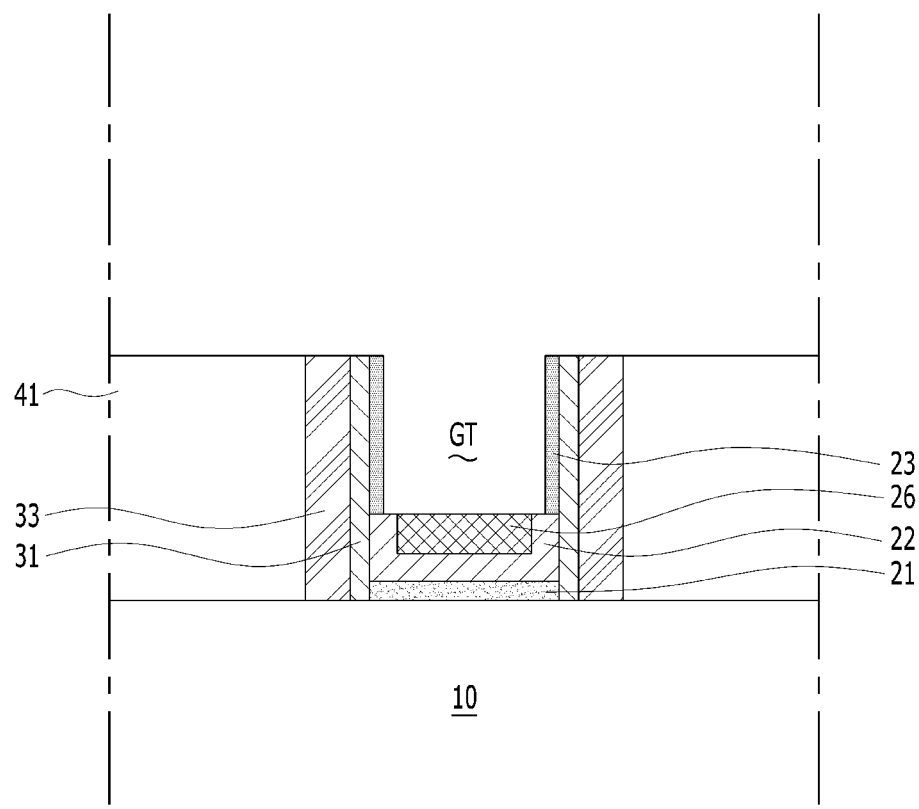
Figure 5K:
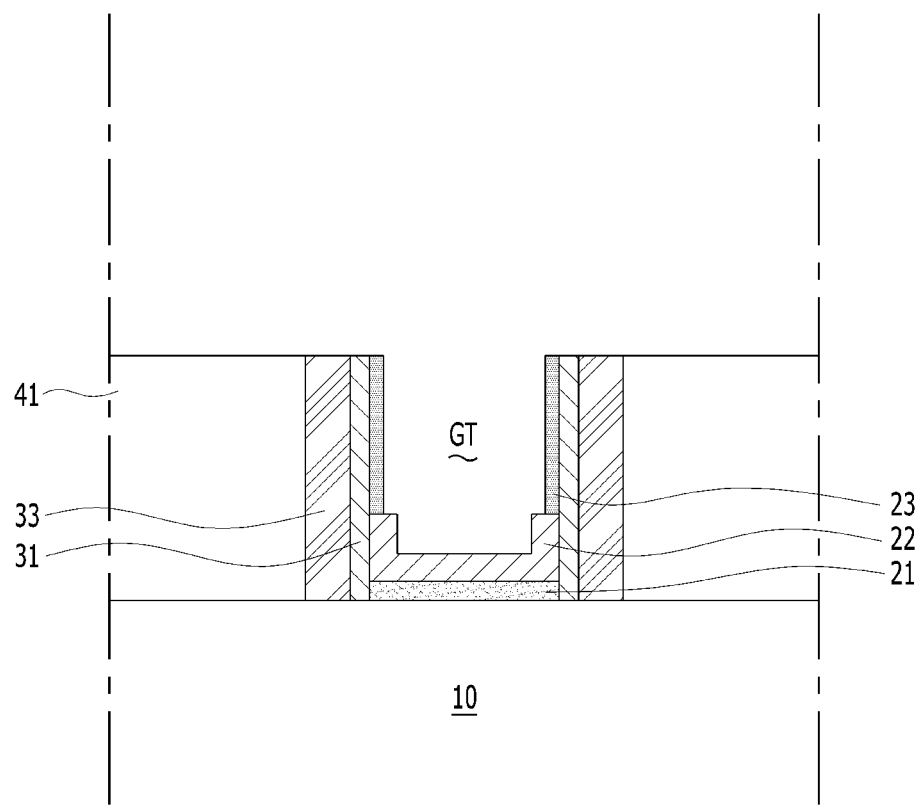
Figure 5L:
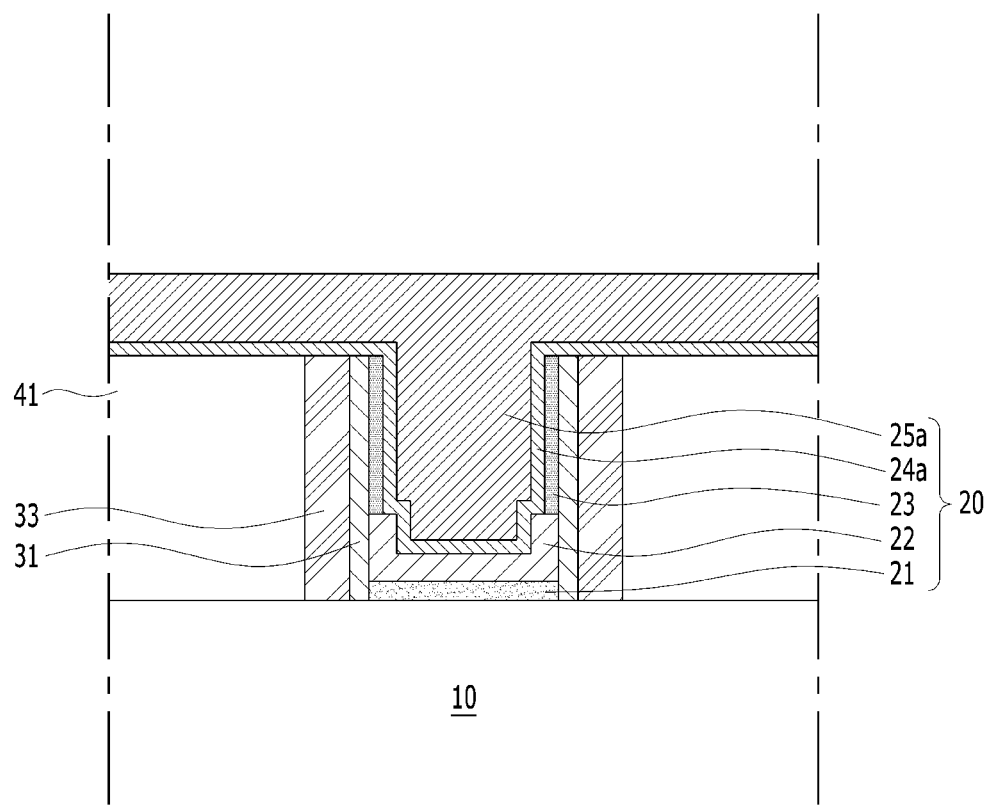
Figure 5M:
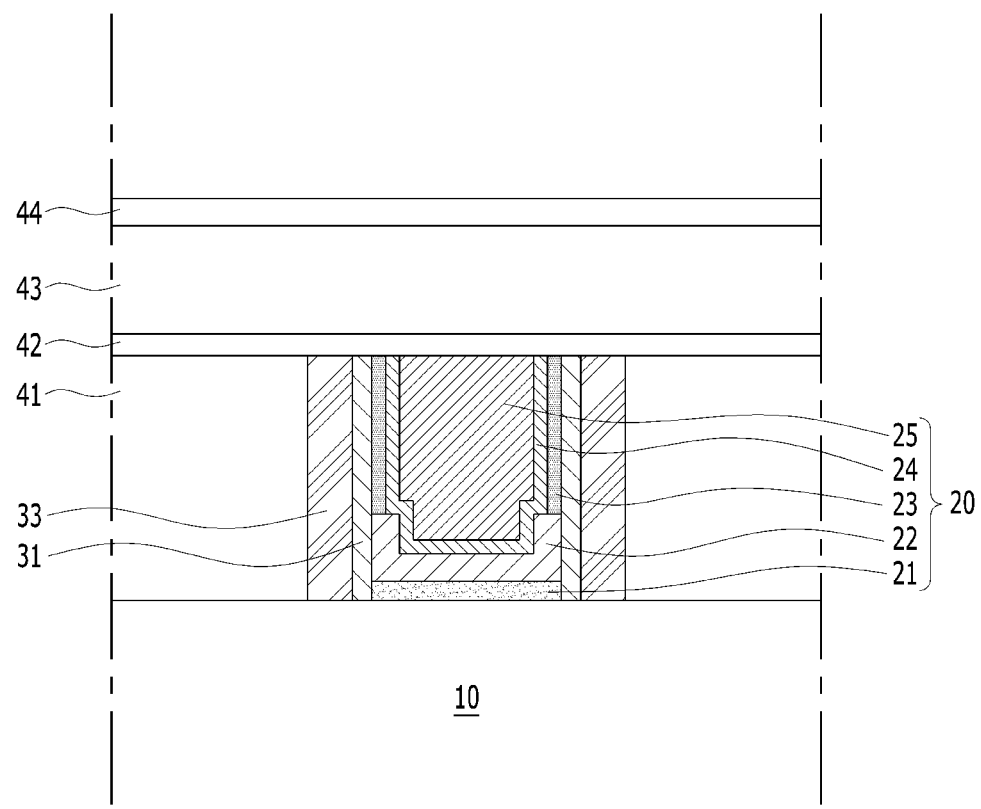
Figure 5N:
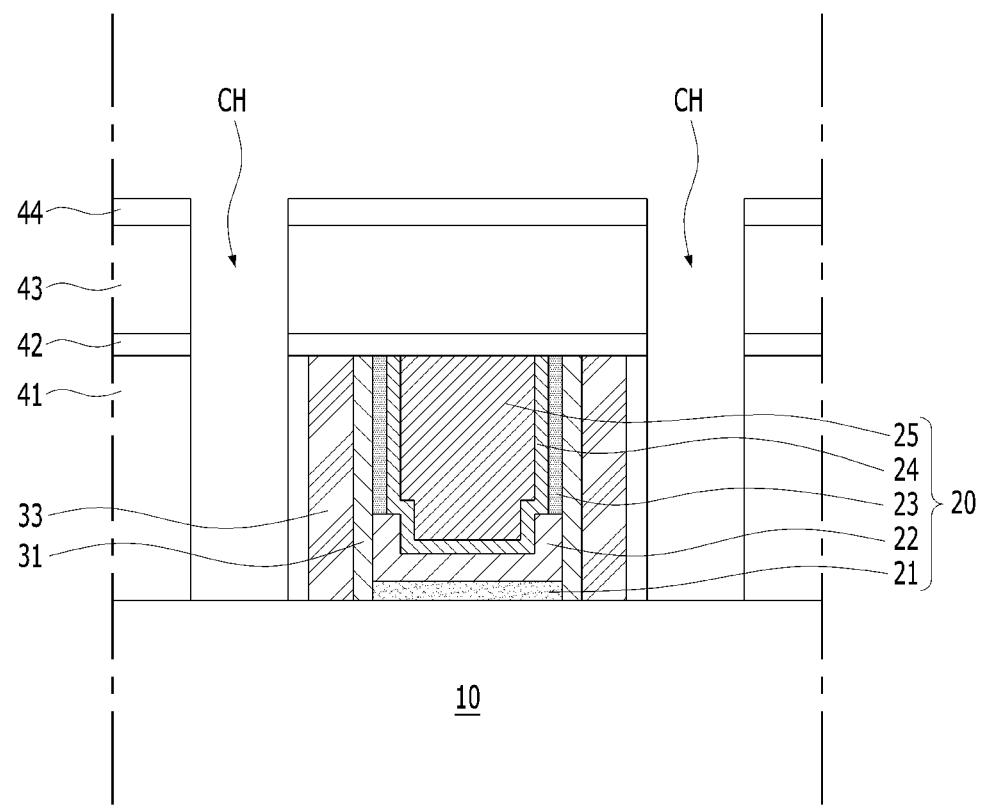
Figure 5O:
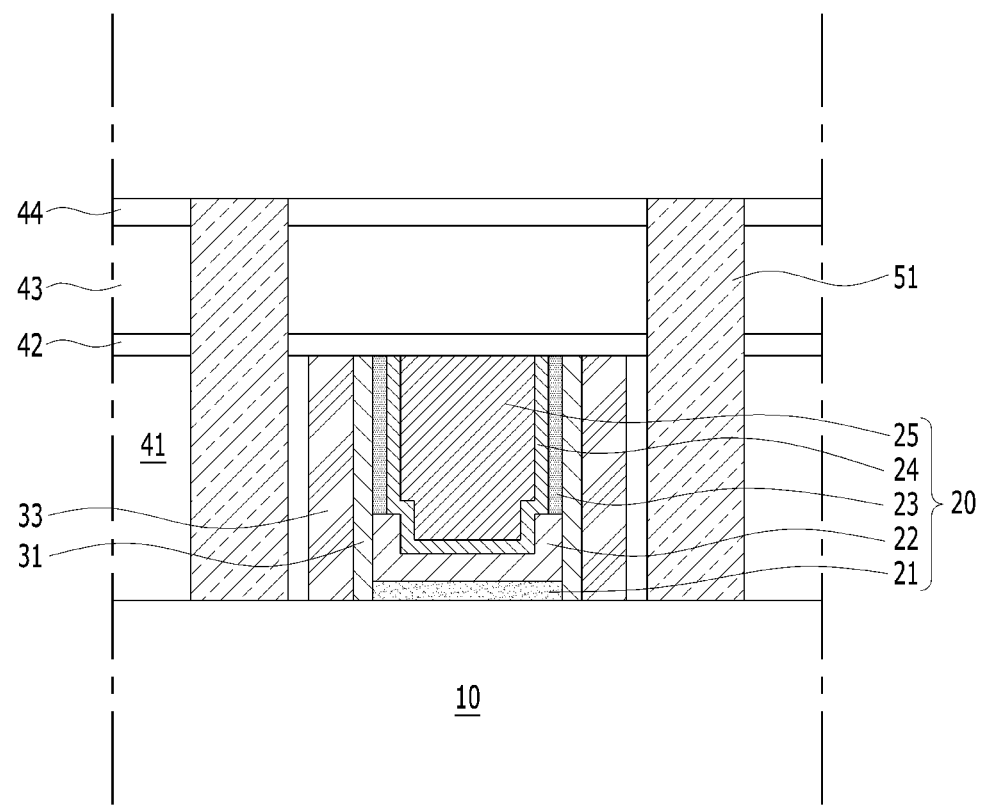

FIGS. 5A to 5O are longitudinal cross-sectional views illustrating a semiconductor device taken along a line I-I' shown in FIG. 1, for describing a method of forming the semiconductor device in accordance with one embodiment of the present disclosure.

Referring to FIG. 5A, a method of manufacturing a semiconductor device in accordance with this embodiment of the present disclosure may include forming a dummy gate structure 20D on a substrate 10. The dummy gate structure 20D may include a dummy gate dielectric layer 27D and a dummy gate electrode 28D. Forming the dummy gate structure 20D may include forming a dummy gate insulating material layer and a dummy gate electrode material layer on the substrate 10 by performing deposition processes, forming a mask pattern M on the dummy gate electrode material layer by performing a photolithography process, and patterning the dummy gate insulating material layer and the dummy gate electrode material layer by performing a patterning process. The dummy gate dielectric layer 27D may include an insulating material such as silicon oxide, and the dummy gate electrode 28D may include polysilicon. The mask pattern M may include a polymeric organic material such as photoresist or a hard mask such as silicon nitride. Subsequently, the mask pattern M may be removed.

Referring to FIG. 5B, the method may further include forming an inner gate spacer layer 31a covering side surfaces and an upper surface of the dummy gate structure 20D. Forming the inner gate spacer layer 31a may include forming an inner spacer material layer covering the substrate 10 and the dummy gate structure 20D, and performing an etch-back process. The dummy gate structure 20D may be covered with the inner gate spacer layer 31a, and a surface of the substrate 10 may be exposed. The inner gate spacer layer 31a may include a silicon oxide-based insulator. For example, the inner gate spacer layer 31a may include one of silicon oxide, silicon carbon oxide, and silicon carbon oxynitride.

Referring to FIG. 5C, the method may further include forming an outer gate spacer layer 33a covering surfaces of the inner gate spacer layer 31a. The forming of the outer gate spacer layer 33a may include forming an outer spacer material layer covering the substrate 10 and the inner gate spacer layer 31a, and performing an etch-back process. The inner gate spacer layer 31a may be covered with the outer gate spacer layer 33a, and the surface of the substrate 10 may be exposed. The outer gate spacer layer 33a may include a silicon nitride-based insulator. For example, the outer gate spacer layer 33a may include silicon nitride, silicon carbon nitride, or silicon carbon oxynitride.

Referring to FIG. 5D, the method may further include forming a lower interlayer insulating layer 41, and exposing the upper surface of the dummy gate structure 20D by performing a planarization process such as a chemical mechanical polishing (CMP) process. The inner gate spacer layer 31a and the outer gate spacer layer 33a on the dummy gate electrode 20D are removed so that the inner gate spacer layer 31a and the outer gate spacer layer 33a may be formed into an inner gate spacer 31 and an outer gate spacer 33.

Referring to FIG. 5E, the method may further include forming a gate trench GT by removing the dummy gate structure 20D. The dummy gate electrode 28D and the dummy gate dielectric layer 27D are removed so that the surface of the substrate 10 may be exposed in the gate trench GT. The gate trench GT may be defined between the inner gate spacers 31. In one embodiment, the method may further include nitriding the inner gate spacers 31 exposed in the gate trench GT by performing a nitridation process. For example, surfaces of the inner gate spacers 31 exposed in the gate trench GT may be modified with silicon nitride, silicon oxynitride, silicon carbon nitride, silicon carbon oxynitride, or a combination thereof, or other compounds containing silicon and nitrogen.

Referring to FIG. 5F, the method may further include forming an interfacial insulating layer 21, a preliminary gate dielectric layer 22a, and a preliminary sacrificial gate electrode 26a in the gate trench GT. The interfacial insulating layer 21 may be directly formed on the substrate 10 exposed in the gate trench GT. For example, Forming the interfacial insulating layer 21 may include oxidizing the surface of the substrate 10 exposed in the gate trench GT by performing an oxidation process. Accordingly, the interfacial insulating layer 21 may include an oxidized silicon layer. The preliminary gate dielectric layer 22a may be conformally formed on an upper surface of the interfacial insulating layer 21 in the gate trench GT and inner side surfaces of the inner gate spacer 31 by performing a deposition process. The preliminary gate dielectric layer 22a may include a high-k dielectric material or a ferroelectric dielectric material. The preliminary sacrificial gate electrode 26a may be formed on the preliminary gate dielectric layer 22a to fill the gate trench GT by performing a deposition process. The preliminary sacrificial gate electrode 26a may have an etch selectivity with respect to the preliminary gate dielectric layer 22a. For example, the preliminary sacrificial gate electrode 26a may include a metal such as titanium (Ti) or a metal compound such as titanium nitride (TiN).

Referring to FIG. 5G, the method may further include forming a sacrificial gate electrode 26 by removing an upper portion of the preliminary sacrificial gate electrode 26a through an etch-back process. The sacrificial gate electrode 26 may remain on the preliminary gate dielectric layer 22a in a lower portion of the gate trench GT.

Referring to FIG. 5H, the method may further include forming a gate dielectric layer 22 by removing an upper portion of the preliminary gate dielectric layer 22a through an etch-back process. The gate dielectric layer 22 may remain in the lower portion of the gate trench GT. The gate dielectric layer 22 may have a U-shaped longitudinal cross-section surrounding a lower surface and side surfaces of the sacrificial gate electrode 26.

Referring to FIG. 5I, the method may further include forming a preliminary gate side insulating layer 23a. The preliminary gate side insulating layer 23a may be conformally formed on the gate dielectric layer 22, the sacrificial gate electrode 26, and inner sidewalls of the inner gate spacer 31 in the gate trench GT. The preliminary gate side insulating layer 23a may include a low dielectric insulating material containing silicon and oxygen, such as silicon carbon oxide (SiCN) or silicon carbon oxynitride (SiCON). Horizontal and vertical thicknesses of the preliminary gate side insulating layer 23a may be smaller than those of the gate dielectric layer 22.

Referring to FIG. 5J, the method may further include forming gate side insulating layers 23. The forming of the gate side insulating layers 23 may include removing the preliminary gate side insulating layer 23a on the gate dielectric layer 22 and the sacrificial gate electrode 26 in the gate trench GT by performing an etch-back process, and leaving the preliminary gate side insulating layer 23a on the inner sidewalls of the inner gate spacer 31. Upper surfaces of the gate dielectric layer 22 and the sacrificial gate electrode 26 may be exposed.

Referring to FIG. 5K, the method may further include removing the sacrificial gate electrode 26. The upper surface of the gate dielectric layer 22 may be exposed in the lower portion of the gate trench GT. As described above, the gate dielectric layer 22 whose central portion is recessed may have a U-shaped cross-sectional shape.

Referring to FIG. 5L, the method may further include forming a preliminary gate barrier layer 24a and a preliminary gate electrode 25a. The preliminary gate barrier layer 24a may be conformally formed on the gate dielectric layer 22 in the gate trench GT and the inner side surfaces of the gate side insulating layers 23 by performing a deposition process. The preliminary gate barrier layer 24a may include a barrier metal such as titanium nitride (TiN). The preliminary gate electrode 25a may be formed on the preliminary gate barrier layer 24a to fill the gate trench GT. The preliminary gate electrode 25a may include a metallic material such as a metal, a metal compound or a metal alloy.

Referring to FIG. 5M, the method may further include forming a gate structure 20, and forming a lower capping layer 42, an intermediate interlayer insulating layer 43, and an intermediate capping layer 44. The forming of the gate structure 20 may include removing the preliminary gate barrier layer 24a and the preliminary gate electrode 25a on the lower interlayer insulating layer 41 by performing a CMP process. An upper surface of the lower interlayer insulating layer 41 may be exposed. The forming of the lower capping layer 42 may include forming an insulating layer having an etch selectivity with respect to the lower interlayer insulating layer 41, such as silicon nitride, by performing a deposition process. The forming of the intermediate interlayer insulating layer 43 may include forming an insulating layer having an etch selectivity with respect to the lower capping layer 42, such as silicon oxide, by performing a deposition process. The forming of the intermediate capping layer 44 may include forming an insulating layer having an etch selectivity with respect to the intermediate interlayer insulating layer 43, such as silicon nitride.

Referring to FIG. 5N, the method may further include forming contact holes CH. The forming of the contact holes CH may include forming an etch mask pattern on the intermediate capping layer 44, and exposing the surface of the substrate 10 by etching the intermediate capping layer 44, the intermediate interlayer insulating layer 43, the lower capping layer 42, and the lower interlayer insulating layer 41, through a photolithography process and an etch process.

Referring to FIG. 5O, the method may further include forming contact plugs 51 in the contact holes CH. The forming of the contact plugs 51 may include forming an insulating liner layer such as silicon nitride, a conductive barrier layer such as titanium nitride (TiN) and a metallic plug such as tungsten (W) in the contact holes CH by performing a deposition process.

Subsequently, referring to FIG. 3A, the method may further include forming the upper interlayer insulating layer 45, the interconnections 53 and the upper capping layer 46. The forming of the upper interlayer insulating layer 45 may include forming an insulating layer having an etch selectivity with respect to the intermediate capping layer 44, such as silicon oxide, by performing a deposition process. The forming of the interconnections 53 may include forming trenches in the upper interlayer insulating layer 45, and forming a conductive material to fill the trenches. The interconnections 53 may each include a conductive barrier layer such as titanium nitride (TiN) and metallic interconnection plugs such as tungsten (W).

FIGS. 6A to 6H are longitudinal cross-sectional views illustrating a semiconductor device taken along the line III-III' shown in FIG. 2, for describing a method of forming a semiconductor device in accordance with another embodiment of the present disclosure. It may be understood that FIGS. 5A to 5N are longitudinal cross-sectional views illustrating the semiconductor device taken along the line II-II' shown in FIG. 2.

Figure 6A:
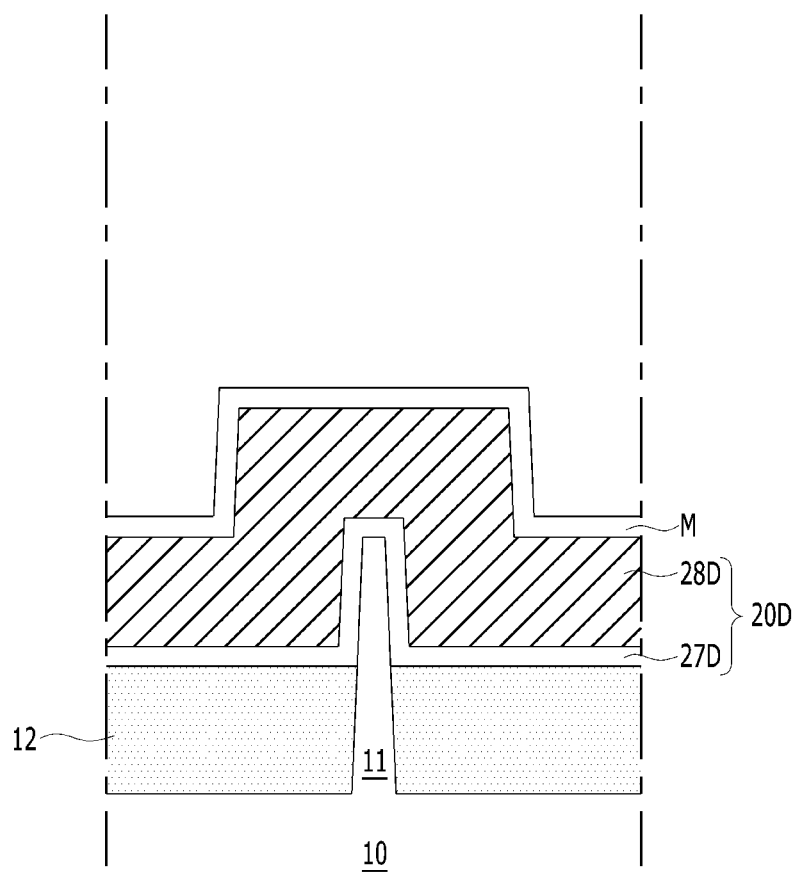
FIGS. 6A to 6H are longitudinal cross-sectional views illustrating a semiconductor device taken along the III-III' line shown in FIG. 2, for describing a method of forming the semiconductor device in accordance with still another embodiment of the present disclosure.

Referring to FIGS. 5A and 6A, a method of forming a semiconductor device in accordance with this embodiment of the present disclosure may include forming an isolation region 12 on the substrate 10 to define a protruding fin active region 11, and forming the dummy gate structure 20D. The fin active region 11 may upwardly protrude from the surface of the substrate 10. The fin active region 11 may be part of the substrate 10. The forming of the isolation region 12 may include selectively recessing an upper portion of the substrate 10 so that the fin active region 11 protrudes, and forming an insulating material layer on the recessed substrate 10. Subsequently, the mask pattern M may be removed.

Figure 6B:
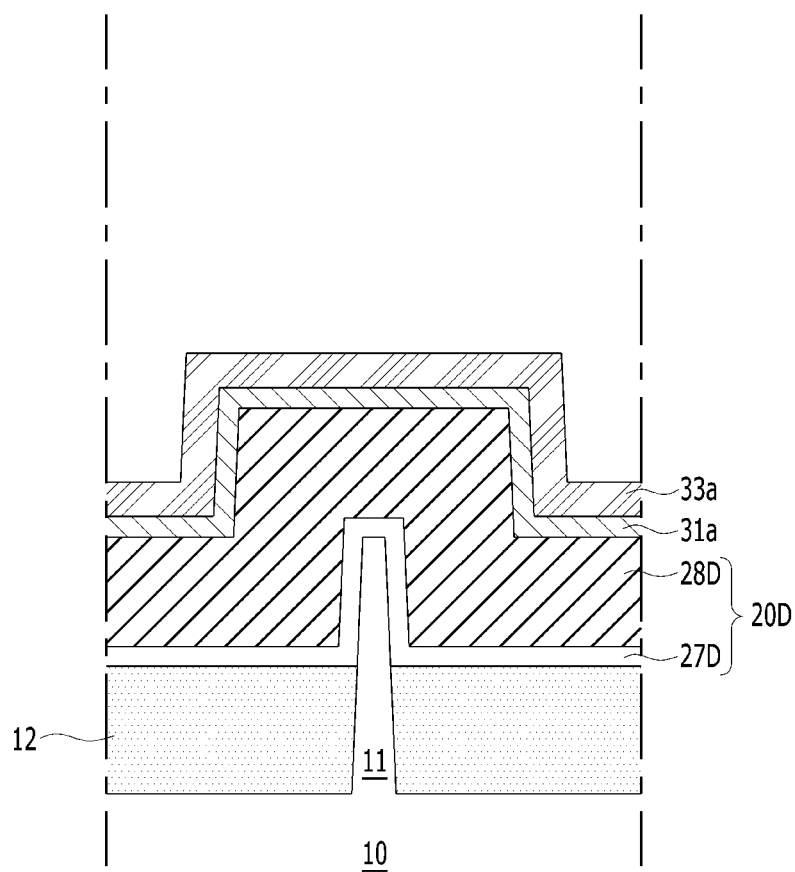

Referring to FIGS. 5B, 5C and 6B, the method may further include forming the inner gate spacer layer 31a and the outer gate spacer layer 33a on the dummy gate structure 20D.

Figure 6C:
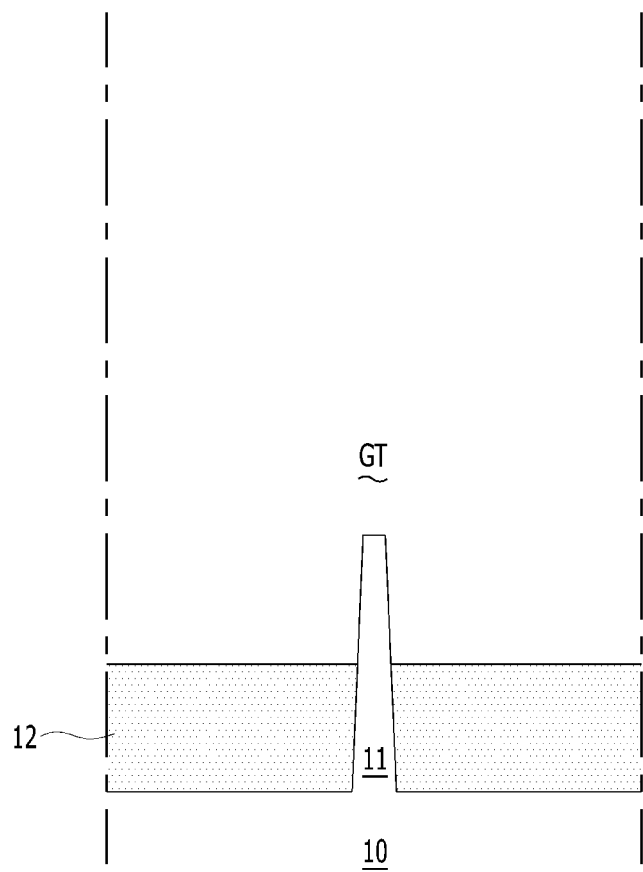

Referring to FIGS. 5D, 5E and 6C, the method may further include forming the gate trench GT by removing the inner gate spacer layer 31a and the outer gate spacer layer 33a formed on the upper surface of the dummy gate structure 20D and also removing the dummy gate structure 20D.

Figure 6D:
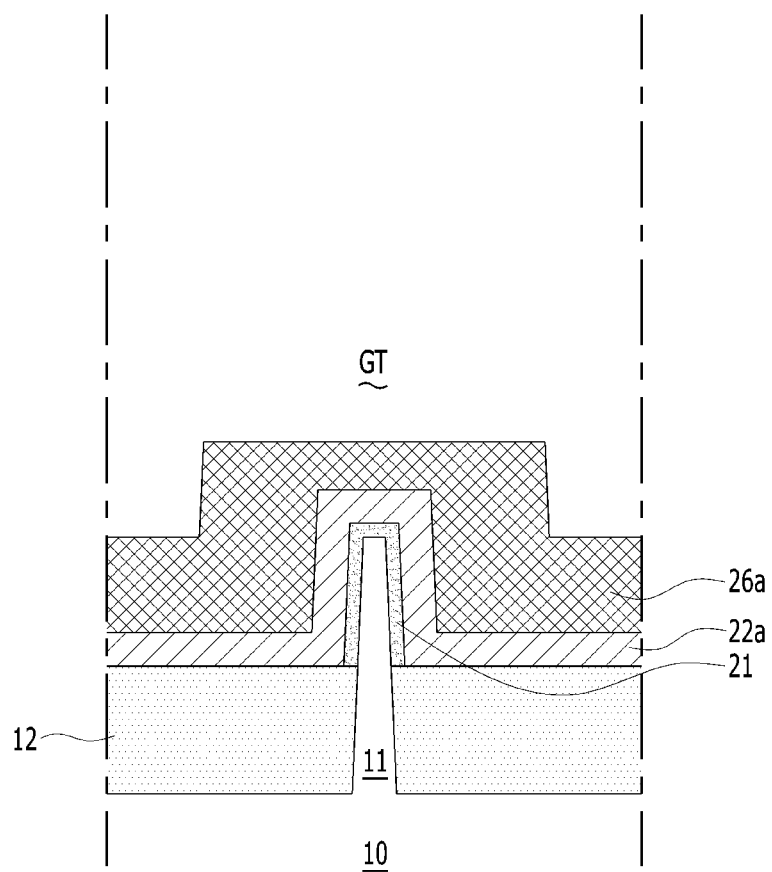

Referring to FIGS. 5F and 6D, the method may further include forming the interfacial insulating layer 21, the preliminary gate dielectric layer 22a and the preliminary sacrificial gate electrode 26a in the gate trench GT. The interfacial insulating layer 21 may be directly formed on the fin active region 11 exposed in the gate trench GT. For example, the forming of the interfacial insulating layer 21 may include oxidizing a surface of the fin active region 11 by performing an oxidation process.

Figure 6E:
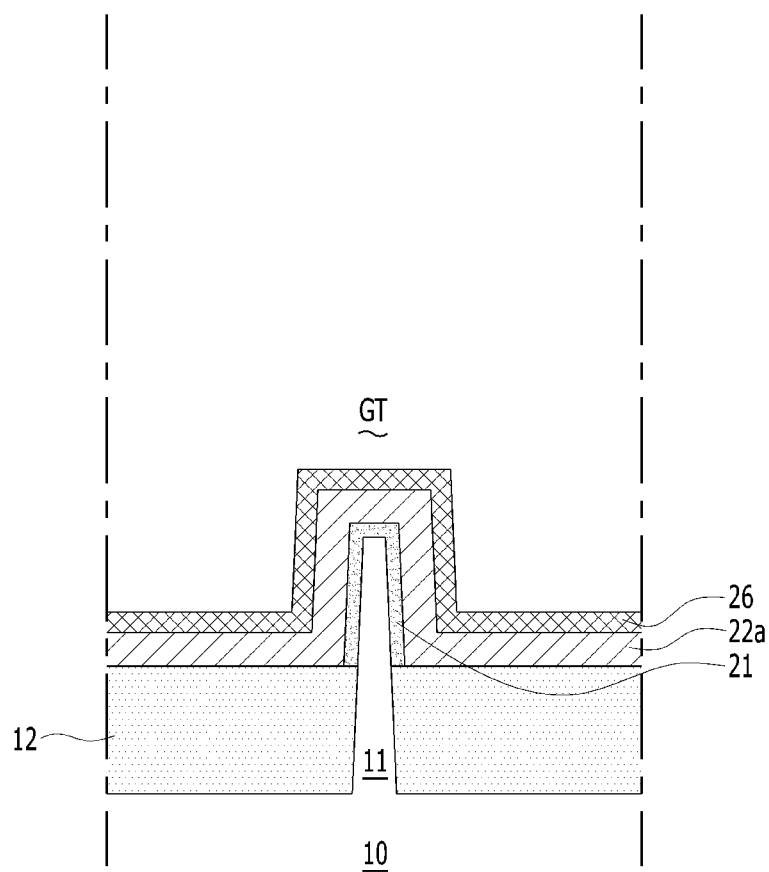

Referring to FIGS. 5G and 6E, the method may further include forming the sacrificial gate electrode 26 by removing the upper portion of the preliminary sacrificial gate electrode 26a through an etch-back process. The sacrificial gate electrode 26 may be conformally formed on the preliminary gate dielectric layer 22a.

Figure 6F:
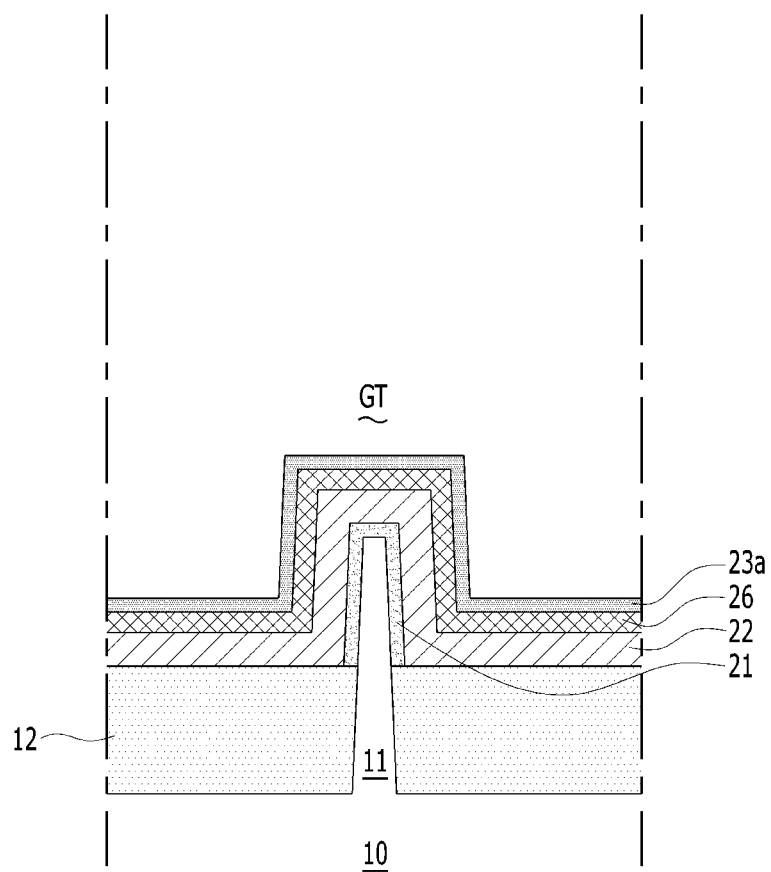

Referring to FIGS. 5H, 5I and 6F, the method may further include forming the gate dielectric layer 22 by removing the upper portion of the preliminary gate dielectric layer 22a, and forming the preliminary gate side insulating layer 23a on the gate dielectric layer 22 and the sacrificial gate electrode 26.

Figure 6G:
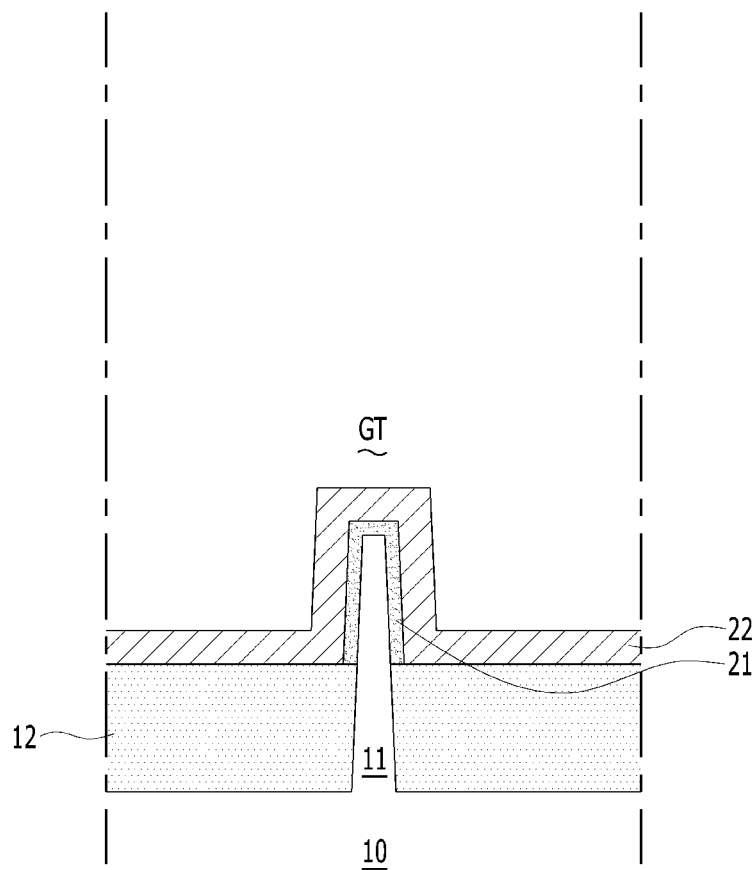

Referring to FIGS. 5J, 5K and 6G, the method may further include forming a gate side insulating layer 23, and removing the sacrificial gate electrode 26. The upper surface of the gate dielectric layer 22 may be exposed in the gate trench GT.

Figure 6H:
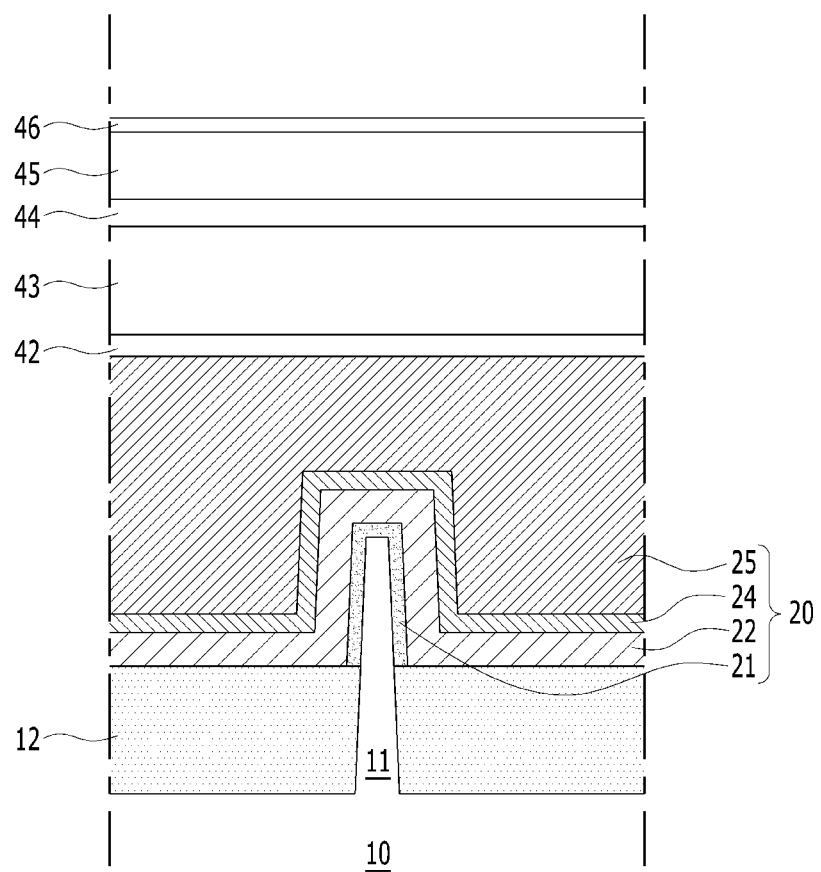

Referring to FIGS. 5L, 5M and 6H, the method may further include forming the gate structure 20, and forming the lower capping layer 42, the intermediate interlayer insulating layer 43 and the intermediate capping layer 44. The gate structure 20 may include the interfacial insulating layer 21, the gate dielectric layer 22, the gate side insulating layer 23 (refer to FIGS. 3L and 3M), a gate barrier layer 24, and a gate electrode 25.

Subsequently, the method may further include forming gate plugs 51, interconnections 53, an upper interlayer insulating layer 45 and an upper capping layer 46 with reference to FIGS. 3A and 4.

According to various embodiments of the present disclosure, parasitic capacitance between the gate electrode and the contact plugs can be reduced.

According to other embodiments of the present disclosure, a volume of the gate electrode can increase.

According to these embodiments of the present disclosure, an RC delay of a semiconductor device can be reduced.

While the present disclosure has been described with respect to specific embodiments, it should be noted that the embodiments are for describing, not limiting, the present disclosure. Further, it should be noted that the present disclosure may be achieved in various ways through substitution, change, and modification, as recognized by those skilled in the art.

What is claimed is:

1. A semiconductor device comprising:
   a substrate having an active region;
   a gate structure crossing the active region of the substrate; and
   spacers formed on both side surfaces of the gate structure,
   wherein the gate structure includes:
   an interfacial insulating layer formed on the substrate;
   a gate dielectric layer formed on the interfacial insulating layer;
   a gate barrier layer and gate side insulating layers formed on the gate dielectric layer; and
   a gate electrode on the gate barrier layer,
   wherein the gate dielectric layer is in contact with inner side surfaces of the spacers, and has a U-shaped longitudinal cross-sectional shape to surround a lower surface and some portions of side surfaces of the gate barrier layer, and
   wherein the gate side insulating layers surround outer side surfaces of the gate barrier layer.

2. The semiconductor device of claim 1, wherein the interfacial insulating layer has a plate shape directly formed on the substrate.

3. The semiconductor device of claim 1, wherein the interfacial insulating layer includes an oxidized silicon layer.

4. The semiconductor device of claim 1,
   wherein the gate dielectric layer includes a high-k dielectric material or a ferroelectric material, and
   wherein the gate side insulating layer includes an insulator having a lower dielectric constant than the gate dielectric layer.

5. The semiconductor device of claim 4, wherein the gate dielectric layer includes at least one selected from the group of hafnium oxide (HfO), zirconium oxide (ZrO), hafnium zirconium oxide (HfZrO), hafnium zirconium oxynitride (HfZrON) and hafnium silicon oxynitride (HfSiON).

6. The semiconductor device of claim 4, wherein the gate side insulating layers each include at least one selected from the group of silicon oxide ($SiO_2$), silicon carbon oxide (SiCO), silicon boron oxide (SiBO), silicon boron carbon oxide (SiBCO) and silicon carbon oxynitride (SiCON).

7. The semiconductor device of claim 1, wherein outer side surfaces of the gate side insulating layers are vertically aligned with outer side surfaces of the gate dielectric layer and are vertically coplanar.

8. The semiconductor device of claim 1, wherein the gate electrode includes a lower portion having a first horizontal width and an upper portion having a second horizontal width, and the first horizontal width is smaller than the second horizontal width.

9. The semiconductor device of claim 8,
   wherein the lower portion of the gate electrode protrudes downwardly to be surrounded by the gate dielectric layer, and
   wherein the upper portion of the gate electrode is surrounded by the gate side insulating layers.

10. The semiconductor device of claim 1,
    wherein the active region comprises a protruding active region protruding from the substrate, and
    wherein the interfacial insulating layer surrounds an upper surface and side surfaces of the protruding active region.

11. A semiconductor device comprising:
    a substrate having an active region;
    a gate structure crossing the active region of the substrate; and
    spacers formed on both side surfaces of the gate structure,
    wherein the gate structure includes:
    a gate electrode;
    a gate barrier layer surrounding a lower surface and side surfaces of the gate electrode;
    a gate dielectric layer surrounding a lower surface and lower portions of side surfaces of the gate barrier layer; and
    gate side insulating layers on upper portions of the side surfaces of the gate barrier layer,
    wherein outer side surfaces of the gate dielectric layer and outer side surfaces of the gate side insulating layers are vertically aligned and are vertically coplanar.

12. The semiconductor device of claim 11,
    wherein the gate dielectric layer has a U-shaped longitudinal cross-sectional shape, and
    wherein at least one of the gate side insulating layers has an I-shaped longitudinal cross-sectional shape.

13. The semiconductor device of claim 11,
    wherein a lower portion of the gate electrode protrudes downwardly to have a first horizontal width, and
    wherein an upper portion of the gate electrode has a second horizontal width larger than the first horizontal width.

14. The semiconductor device of claim 13,
    wherein the lower portion of the gate electrode is surrounded by the gate dielectric layer, and
    wherein the upper portion of the gate electrode is surrounded by the gate side insulating layers.

15. The semiconductor device of claim 11, further comprising an interfacial insulating layer formed between the substrate and the gate dielectric layer.

16. A semiconductor device comprising:
    a substrate having an active region a) including source/drain regions and b) protruding upward from the substrate;
    contact plugs connecting to the active region;
    a gate structure crossing a section of the active region in between the metal contact plugs; and
    at least one insulating gate spacer disposed a) adjacent the gate structure and b) between each contact plug and the gate structure,
    wherein the gate structure includes:
    a gate electrode,
    a gate barrier layer surrounding a lower surface and side surfaces of the gate electrode,
    a gate dielectric layer surrounding a lower surface and lower portions of side surfaces of the gate barrier layer, and
    gate side insulating layers disposed on upper portions of the side surfaces of the gate barrier layer, and
    wherein the gate dielectric layer includes a high-k dielectric material or a ferroelectric material, and
    the gate side insulating layers include insulators having a lower dielectric constant than the gate dielectric layer.

17. The semiconductor device of claim 16, further comprising an interfacial insulating layer formed between the active region and the gate dielectric layer.

18. The semiconductor device of claim 16, wherein the gate dielectric layer surrounding the lower surface and the lower portions of side surfaces of the gate barrier layer has a U-shaped longitudinal cross-sectional shape.

19. The semiconductor device of claim 16, wherein outer side surfaces of the gate side insulating layers and outer side surfaces of the gate dielectric layer are vertically coplanar.

* * * * *